(12) United States Patent
Kim et al.

(10) Patent No.: US 7,038,511 B2
(45) Date of Patent: *May 2, 2006

(54) SYSTEM AND METHOD FOR COMPARISON AND COMPENSATION OF DELAY VARIATIONS BETWEEN FINE DELAY AND COARSE DELAY CIRCUITS

(75) Inventors: Kang Yong Kim, Boise, ID (US); Gary Johnson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/940,187

(22) Filed: Sep. 13, 2004

(65) Prior Publication Data

US 2005/0030075 A1    Feb. 10, 2005

Related U.S. Application Data

(63) Continuation of application No. 10/613,302, filed on Jul. 2, 2003, now Pat. No. 6,812,760.

(51) Int. Cl.
*H03L 7/06* (2006.01)

(52) U.S. Cl. ................. 327/158; 327/161; 375/376

(58) Field of Classification Search ........ 327/156–162, 327/147–153, 262, 363; 375/373–376; 331/16–17, 331/1 A, DIG. 2
See application file for complete search history.

(56) References Cited

U.S. PATENT DOCUMENTS

| | | | |
|---|---|---|---|
| 4,922,141 A | 5/1990 | Lofgren et al. | 327/158 |
| 5,295,164 A | 3/1994 | Yamamura | 375/376 |
| 5,336,940 A | 8/1994 | Sorrells et al. | 327/276 |
| 5,684,421 A | 11/1997 | Chapman et al. | 327/261 |
| 6,101,197 A | 8/2000 | Keeth et al. | 370/517 |
| 6,327,318 B1 | 12/2001 | Bhullar et al. | 375/374 |
| 6,445,231 B1 | 9/2002 | Baker et al. | 327/158 |
| 6,472,921 B1 | 10/2002 | Rao et al. | 327/237 |
| 6,480,047 B1 | 11/2002 | Abdel-Maguid et al. | 327/161 |
| 6,483,359 B1 | 11/2002 | Lee | 327/158 |
| 6,489,823 B1 | 12/2002 | Iwamoto | 327/158 |
| 6,531,926 B1 | 3/2003 | Pate et al. | 331/17 |
| 6,628,154 B1 | 9/2003 | Fiscus | 327/158 |
| 2003/0012320 A1 | 1/2003 | Bell | 375/376 |

*Primary Examiner*—Minh Nguyen
(74) *Attorney, Agent, or Firm*—Dorsey & Whitney LLP

(57) ABSTRACT

A compensation circuit and method for compensating for variations in time delay adjustments of synchronizing circuits that synchronize an external clock signal applied to an integrated circuit with internal clock signals generated in the integrated circuit in response to the external clock signal. The time delay relationship between fine and coarse delay circuits of an adjustable delay circuit is adjusted to compensate for variations from an expected time delay relationship.

29 Claims, 8 Drawing Sheets

SYSTEM AND METHOD FOR COMPARISON AND COMPENSATION OF DELAY VARIATIONS BETWEEN FINE DELAY AND COARSE DELAY CIRCUITS

CROSS-REFERENCE TO RELATED APPLICATION

This application is a continuation of U.S. patent application Ser. No. 10/613,302, filed Jul. 2, 2003, issued as U.S. Pat. No. 6,812,760 on Nov. 2, 2004.

TECHNICAL FIELD

The present invention relates generally to integrated circuits, and more specifically, to compensating for variations in time delay adjustments of synchronizing circuits that synchronize an external clock signal applied to an integrated circuit with internal clock signals generated in the integrated circuit in response to the external clock signal.

BACKGROUND OF THE INVENTION

In synchronous integrated circuits, the integrated circuit is clocked by an external clock signal and performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations. For example, commands are placed on a command bus of the memory device in synchronism with the external clock signal, and the memory device must latch these commands at the proper times to successfully capture the commands. To latch the applied commands, an internal clock signal is developed in response to the external clock signal, and is typically applied to latches contained in the memory device to thereby clock the commands into the latches. The internal clock signal and external clock must be synchronized to ensure the internal clock signal clocks the latches at the proper times to successfully capture the commands. In the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay, causing the internal clock signal to be phase shifted relative to the external clock signal. As long as the phase-shift is minimal, timing within the memory device can be easily synchronized to the external timing. To increase the rate at which commands can be applied and at which data can be transferred to and from the memory device, the frequency of the external clock signal is increased, and in modem synchronous memories the frequency is in excess of 100 MHz. As the frequency of the external clock signal increases, however, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result, the commands applied to the memory device may no longer be valid by the time the internal clock signal clocks the latches.

To synchronize external and internal clock signals in modern synchronous memory devices, a number of different approaches have been considered and utilized, including delay-locked loops (DLLs), phased-locked loops (PLLs), and synchronous mirror delays (SMDs), as will be appreciated by those skilled in the art. As used herein, the term synchronized includes signals that are coincident and signals that have a desired delay relative to one another. FIG. 1 is a functional block diagram illustrating a conventional delay-locked loop 100 including a variable delay line 102 that receives a clock buffer signal CLKBUF and generates a delayed clock signal CLKDEL in response to the clock buffer signal. The variable delay line 102 controls a variable delay VD of the CLKDEL signal relative to the CLKBUF signal in response to a delay adjustment signal DADJ. A feedback delay line 104 generates a feedback clock signal CLKFB in response to the CLKDEL signal, the feedback clock signal having a model delay D1+D2 relative to the CLKDEL signal. The D1 component of the model delay D1+D2 corresponds to a delay introduced by an input buffer 106 that generates the CLKBUF signal in response to an external clock signal CLK, while the D2 component of the model delay corresponds to a delay introduced by an output buffer 108 that generates a synchronized clock signal CLKSYNC in response to the CLKDEL signal. Although the input buffer 106 and output buffer 108 are illustrated as single components, each represents all components and the associated delay between the input and output of the delay-locked loop 100. The input buffer 106 thus represents the delay D1 of all components between an input that receives the CLK signal and the input to the variable delay line 102, and the output buffer 108 represents the delay D2 of all components between the output of the variable delay line and an output at which the CLKSYNC signal is developed.

The delay-locked loop 100 further includes a phase detector 110 that receives the CLKFB and CLKBUF signals and generates a delay control signal DCONT having a value indicating the phase difference between the CLKBUF and CLKFB signals. One implementation of a phase detector is described in U.S. Pat. No. 5,946,244 to Manning ("Manning patent"), which is assigned to the assignee of the present patent application and which is incorporated herein by reference. A delay controller 112 generates the DADJ signal in response to the DCONT signal from the phase detector 110, and applies the DADJ signal to the variable delay line 102 to adjust the variable delay VD. The phase detector 110 and delay controller 112 operate in combination to adjust the variable delay VD of the variable delay line 102 as a function of the detected phase between the CLKBUF and CLKFB signals.

In operation, the phase detector 110 detects the phase difference between the CLKBUF and CLKFB signals, and the phase detector and delay controller 112 operate in combination to adjust the variable delay VD of the CLKDEL signal until the phase difference between the CLKBUF and CLKFB signals is approximately zero. More specifically, as the variable delay VD of the CLKDEL signal is adjusted, the phase of the CLKFB signal from the feedback delay line 104 is adjusted accordingly until the CLKFB signal has approximately the same phase as the CLKBUF signal. When the delay-locked loop 100 has adjusted the variable delay VD to a value causing the phase shift between the CLKBUF and CLKFB signals to equal approximately zero, the delay-locked loop is said to be "locked." When the delay-locked loop 100 is locked, the CLK and CLKSYNC signals are synchronized. This is true because when the phase shift between the CLKBUF and CLKFB signals is approximately zero (i.e., the delay-locked loop 100 is locked), the variable delay VD has a value of NTCK−(D1+D2) as indicated in FIG. 1, where N is an integer and TCK is the period of the CLK signal. When VD equals NTCK−(D1+D2), the total delay of the CLK signal through the input buffer 106, variable delay line 102, and output buffer 108 is D1+NTCK−(D1+D2)+D2, which equals NTCK. Thus, the CLKSYNC signal is delayed by NTCK relative to the CLK signal and the two signals are synchronized since the delay is an integer multiple of the period of the CLK signal. Referring back to the discussion of synchronous memory devices above, the CLK signal corresponds to the external clock signal and the CLKDEL signal corresponds to the internal clock signal.

FIG. 2 is a signal timing diagram illustrating various signals generated during operation of the delay-locked loop 100 of FIG. 1. In response to a rising-edge of the CLK signal at a time T0, the CLKBUF signal goes high the delay D1 later at a time T1. Initially, the variable delay VD as a value VD1, causing the CLKDEL signal to go high at a time T3 and the CLKSYNC signal to go high at a time T4. At this point, note that the positive-edge of the CLKSYNC signal at the time T4 is not synchronized with the CLK signal, which transitions high at a time T5. In response to the rising-edge of the CLKDEL signal at the time T3, the CLKFB goes high at a time T6, which occurs before a positive-edge of the CLKBUF signal occurring at a time T7. Thus, the positive-edge of the CLKFB signal occurs at the time T6 while the positive-edge of the CLKBUF occurs at the time T7, indicating there is a phase shift between the two signals. The phase detector 110 (FIG. 1) detects this phase difference, and generates the DCONT signal just after the time T7 at a time T8 which, in turn, causes the delay controller 112 (FIG. 1) to generate the DADJ signal to adjust the value of the variable delay VD to a new value VD2.

In response to the new variable delay VD2, the next rising-edge of the CLKDEL signal occurs at a time T9. The CLKSYNC signal transitions high the delay D2 later at a time T10 and in synchronism with a rising-edge of the CLK signal. At this point, the delay-locked loop 100 is locked. In response to the positive-edge transition of the CLKDEL signal at the time T9, the CLKFB signal transitions high at a time T11 in synchronism with the CLKBUF signal. Once again, the phase detector 110 (FIG. 1) detects the phase difference between the CLKBUF and CLKFB signals, which in this case is approximately zero, and generates the DCONT signal just after the time T11 in response to the detected phase difference. In this situation, the generated DCONT signal would not cause the variable delay VD2 to be adjusted since the delay-locked loop 100 is locked. Moreover, although the relative phases of the CLKBUF and CLKFB signals is detected in response to each rising-edge of these signals, the variable delay VD may not be adjusted immediately even where such a phase difference is detected. For example, the variable delay VD may be adjusted only when a phase difference between the CLKFB and CLKBUF signals exists for a predetermined time or exceeds a predetermined magnitude. In this way, the phase detector 110 and delay controller 112 can provide a sort of "filtering" of jitter or variations in the CLK signal, as will be understood in the art.

In the delay-locked loop 100, each cycle of the CLK signal the phase detector 110 compares rising-edges of the CLKBUF and CLKFB signals and generates the appropriate DCONT signal to incrementally adjust the variable delay VD until the delay-locked loop 100 is locked. The phase detector 110 could also compare falling-edges of the CLKBUF and CLKFB signals, as in the previously mentioned Manning patent. In this way, the delay-locked loop 100 incrementally adjusts the variable delay VD once each cycle of the CLK signal. Although the example of FIG. 2 illustrates the delay-locked loop 100 as locking and therefore synchronizing the CLK and CLKSYNC signals after only two cycles of the CLK signal, the delay-locked loop typically takes as many as 200 cycles of the CLK signal to lock. Before the delay-locked loop 100 is locked, the CLKSYNC signal cannot be used to latch signals being applied to the synchronous memory device containing the delay-locked loop. As a result, the time it takes to lock the delay-locked loop 100 may slow the operation of the associated synchronous memory device. For example, in a conventional double data rate (DDR) SDRAM, the delay-locked loop is automatically disabled when the SDRAM enters a self-refresh mode of operation. Upon exiting the self-refresh mode, 200 cycles of the applied CLK signal must then occur before read or write data transfer commands can be applied to the SDRAM.

In the delay-locked loop 100, the variable delay line 102 is typically formed from a number of serially-connected individual delay stages (not shown), with individual delay stages being added or removed to adjust the variable delay VD, as will be understood by those skilled in the art. For example, a plurality of serially-connected inverters could be used to form the variable delay line 102, with the output from different inverters being selected in response to the DADJ to control the variable delay VD. A large number of stages in the variable delay line 102 is desirable with each stage having an incremental delay to provide better resolution in controlling the value of the variable delay VD, where the resolution of the delay-locked loop 100 is the smallest increment of delay that may be added and subtracted from the variable delay VD.

The variable delay line 102 may include separate coarse and fine delay lines that incrementally adjust the variable delay VD by a unit coarse delay CD and a unit fine delay FD, respectively, responsive to the DADJ signal. In this situation, the variable delay VD equals a number M of unit coarse delays CD being utilized plus a number N of unit fine delays FD being utilized (VD=M×CD+N×FD). By separating the delay line 102 into coarse and fine delay lines, the variable delay VD may be more quickly adjusted, enabling the delay-locked loop 100 to more quickly lock.

With this approach, however, the resolution of the delay-locked loop 100 may be adversely affected by the use of separate coarse and fine delay lines due to the variations between the unit coarse delays CD and unit fine delays FD. Ideally, each unit coarse delay CD equals Q unit fine delays FD (CD=Q×FD) where Q is an integer. When Q×FD does not equal CD, the resolution of the delay-locked loop 100 may be adversely affected since the sum of the coarse delays CD plus the fine delays FD being utilized may vary from the expected variable delay VD by more than the fine delay FD, as will be appreciated by those skilled in the art. For example, if the maximum time delay of the fine delay is either less than or greater than expected, making a transition from the fine delay to a coarse delay will result in a non-linear adjustment of the delay time of the variable delay line 102. As a result, the adjustment made by the delay controller 112 will cause the variable delay line 102 to jump several unit fine delays, either forwards or backwards. The non-linearities in the adjustment may ultimately cause phase lock between two signals to be lost or prolong the time necessary for the delay-locked loop 100 to lock, which as previously mentioned, is considerable even under ideal conditions.

Variations from the expected relationship between the coarse delays and unit fine delays can be caused by a variety of factors, such as processing variations during fabrication, voltage variations of the system in which the device is located, temperature variations of the environment in which the device is operating, and the like. Thus, even if the expected relationship exists under certain operating conditions, variations in that expected relationship can occur when those operating conditions change. Therefore, there is a need for methods and systems of compensating for variations in the expected time delay relationship between fine and coarse delay circuits in a synchronizing circuit.

SUMMARY OF THE INVENTION

According to one aspect of the invention, a method for compensating for variance from a relationship between a first delay circuit and a second delay circuit is provided. The method includes determining a relationship between a first delay of the first delay circuit and a second delay of the second delay circuit, and adjusting a parameter affecting the relationship between the first delay and the second delay in response to the determined relationship being outside a variance range. According to another aspect of the invention, a method for compensating for variance from a relationship between a fine delay circuit and a coarse delay circuit of a variable delay line is provided. The method includes determining a current relationship between the fine delay and the coarse delay. and setting a transition point at which the variable delay line switches from a fine delay circuit to a coarse delay circuit based on the current determined relationship to compensate for the variance.

In another aspect of the invention, a method for determining a relationship between a first delay and a second delay is provided. The method includes delaying a clock signal by a reference delay to provide a first delayed clock signal and delaying the clock signal by an adjustable delay to provide a second delayed clock signal. The reference time delay is equal to the total delay of the first and second delays and the adjustable delay is set by a control signal. The method further includes determining a phase relationship between the first and second delayed clock signals, and generating a phase adjustment signal indicative of the phase relationship for use as the control signal for the adjustable delay. The phase adjustment signal is further indicative of the relationship between the first delay and the second delay when the first and second delayed clock signals are in phase.

In another aspect of the invention, a method for determining a relationship between a fine delay circuit having a fine delay and a coarse delay circuit having a coarse delay is provided. The method includes determining a phase relationship between a reference delay clock signal and an adjustable delay clock signal. The reference delay clock signal is delayed from an input clock signal by the fine delay and the coarse delay and the adjustable delay clock signal is delayed from the input clock signal by an adjustable time delay. A compensation signal is generated based on the phase relationship between the reference delay clock signal and the adjustable delay clock signal. The adjustable time delay is adjusted to correct for the phase difference between the reference delay clock signal and the adjustable delay clock signal responsive to the compensation signal. The resulting compensation signal at phase lock is representative of a ratio between the fine delay of the fine delay circuit and the coarse delay of the coarse delay circuit.

DETAILED DESCRIPTION OF THE INVENTION

Embodiments of the present invention are directed to compensating for variations in time delay adjustments of synchronizing circuits that synchronize an external clock signal applied to an integrated circuit with internal clock signals generated in the integrated circuit in response to the external clock signal. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
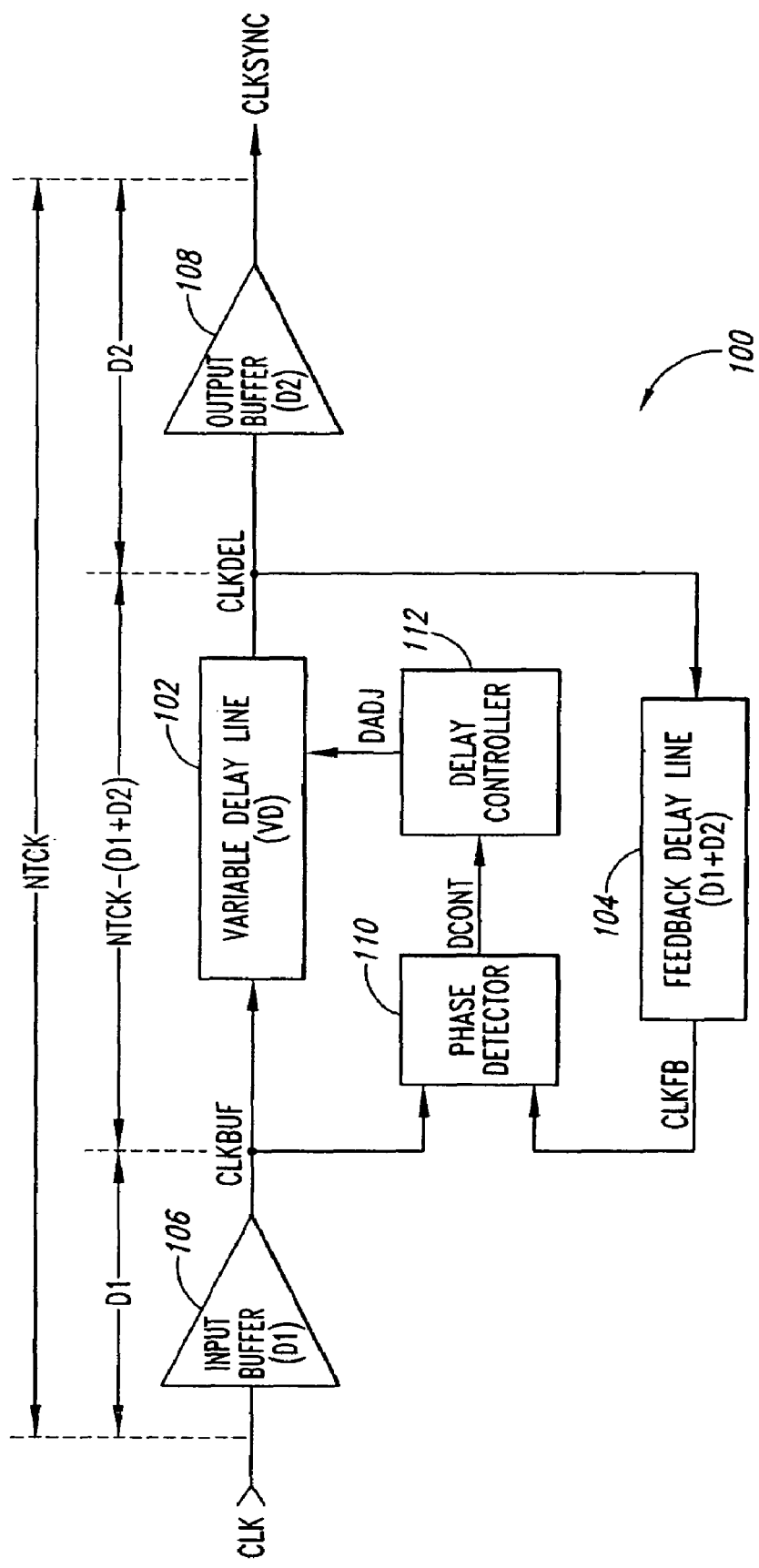
FIG. 1 is a functional block diagram of a conventional delay-locked loop.
Figure 2:
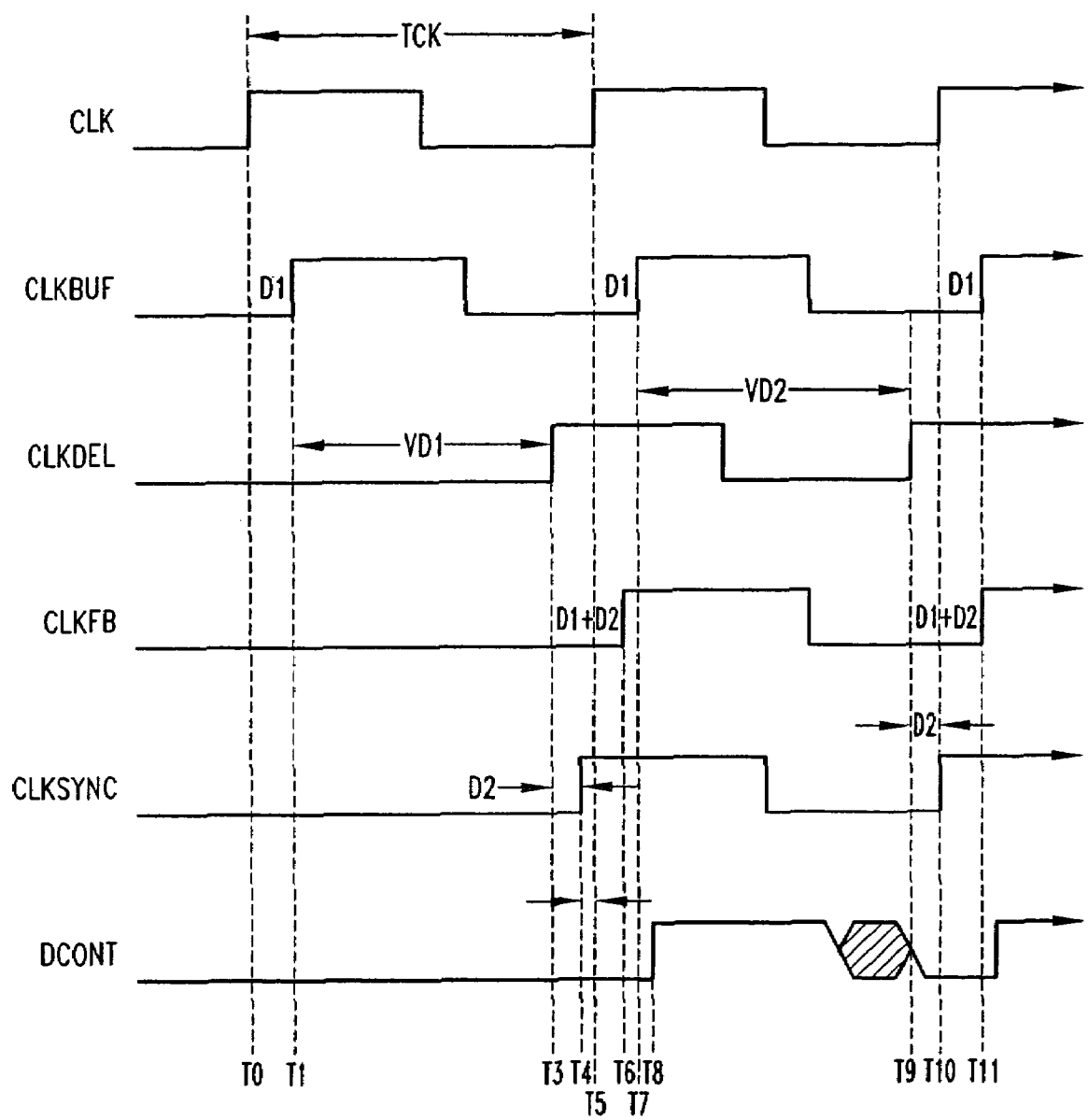
FIG. 2 is a signal timing diagram illustrating various signals generated during operation of the delay-locked loop of FIG. 1.
Figure 3:
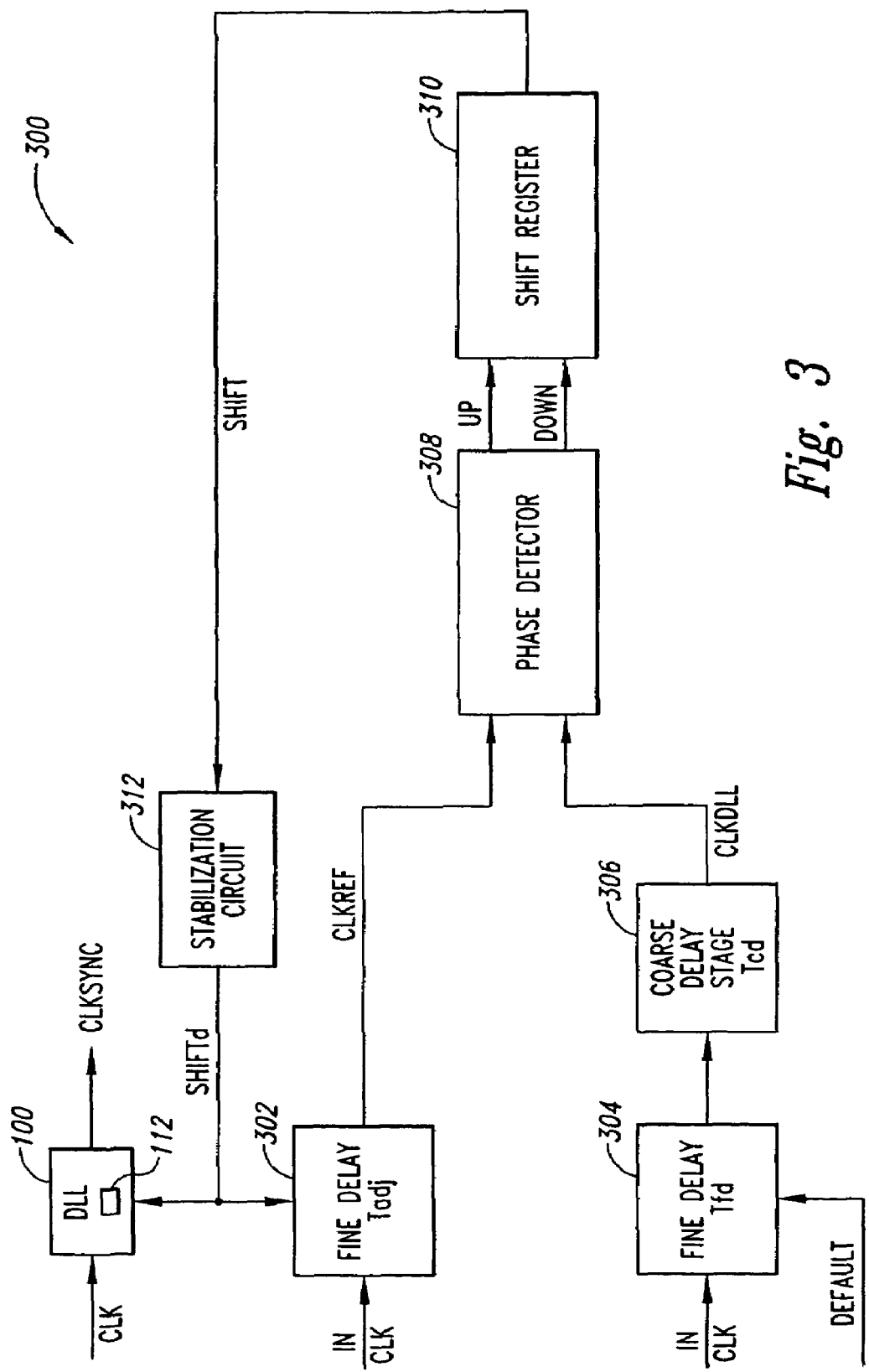
FIG. 3 is a functional block diagram of a fine/coarse delay comparison circuit according to an embodiment of the present invention.

FIG. 3 illustrates a fine/coarse delay comparison circuit 300 according to an embodiment of the present invention. The fine/coarse delay comparison circuit 300 includes an adjustable fine delay circuit 302 that receives an input clock signal CLK and provides a delayed clock signal CLKREF. The CLKREF signal, which is delayed from the CLK signal by a delay time Tadj, is provided to a first input of a phase detector 308. The fine/coarse delay comparison circuit 300 further includes a reference fine delay circuit 304 that receives the CLK signal and is coupled in series to a coarse delay stage 306. The reference fine delay circuit 304 is similar to the adjustable fine delay circuit 302, however, the control signal applied to the reference fine delay circuit 304 is set to a constant value, for example, the input control terminal of the reference fine delay circuit 304 can be coupled to ground, in order to set a "reference" delay time for a fine delay circuit.

A delayed clock signal CLKDLL is output from the coarse delay stage 306 to a second input of the phase detector 308. The CLKDLL signal is delayed from the CLK signal by a delay time of (Tfd+Tcd), where Tfd is the time delay of the reference fine delay circuit 304 and Tcd is the time delay of the coarse time delay stage 306. The phase comparator 308 compares the phase relationship of the CLKREF and CLKDLL signals, and in response, outputs an up-shift signal UP and a down-shift signal DOWN to a shift register 310. The shift register 310 modifies a value stored therein in accordance with the UP and DOWN signals received from the phase comparator 308, and outputs a control signal SHIFT that is fed back to a signal stabilization circuit 312. The signal stabilization circuit 312, as will be explained in greater detail below, stabilizes the SHIFT signal in the event signal rippling occurs. A stabilized signal SHIFTd generated by the delay compensation circuit is provided to the adjustable fine delay circuit 302. The SHIFTd signal has a characteristic that is representative of the value stored in the shift register 310, and as will be explained in more detail below, is provided to the delay controller 112 of the DLL 100 in order to compensate for variations from the expected relationship between the number of fine delay stages having an equivalent time delay to one coarse time delay stage. Thus, with the compensation provided by the SHIFTd signal, erratic, and non-linear time delay adjustments in the variable delay line of a delay-locked loop can be avoided. Modifications that should be made to the delay controller 112 and the DLL 100 in order to use the SHIFTd signal for compensation is well within the understanding of those ordinarily skilled in the art, and consequently, will not be discussed herein in the interest of brevity.

The adjustable and reference fine delay circuits 302 and 304, the coarse delay stage 306, the phase detector 308, and the shift register 310 are conventional. These circuits are well known to those ordinarily skilled in the art, and can be designed and implemented using conventional designs. For example, as well known in the art, the adjustable fine delay circuit 302 includes several unit fine delay stages that can be activated or disabled to change the delay time of the fine delay circuit 302. Activation and disablement of the fine delay stages can be based on a characteristic of a control signal, such as the SHIFTd signal previously described. For example, the delay time of the adjustable fine delay circuit 302 can be adjusted based on the voltage value of the SHIFTd signal. Alternatively, the SHIFTd signal can include multiple signals that are used to represent a multiple-bit binary value, and the delay time of the fine delay circuit 302 is based on the binary value of the SHIFTd signal. It will be appreciated that modifications, such as those previously described, are well within the understanding of those ordinarily skilled in the art and can be made without exceeding the scope of the present invention.

In operation, the phase detector 308 detects the phase difference of the CLK signal delayed by the adjustable fine delay circuit 302 (i.e., the CLKREF signal) and the CLK signal delayed by the reference fine delay circuit 304 and the coarse delay stage 306 (i.e., the CLKDLL signal). The phase detector 308 outputs the UP and DOWN signals based on the phase relationship between the CLKREF and CLKDLL signals. The UP and DOWN signals are provided to the shift register 310 to adjust the value of the SHIFT signal output by the shift register 310. The SHIFT signal is provided to the signal stabilization circuit 312 to stabilize rippling of the SHIFT signal if rippling present, and the SHIFTd signal is applied to the adjustable fine delay unit 302 in order to adjust the delay time of the adjustable fine delay unit 302 so that the phase of the clock signals CLKREF and CLKDLL input to the phase detector 308 are synchronized. It will be appreciated that the SHIFT signal output by the shift register 310 can also be used to adjust the delay time of the adjustable fine delay circuit 302 instead of the SHIFTd signal in the event that having the signal stabilization circuit 312 is not desirable or necessary. Thus, in an alternative embodiment of the present invention, the signal stabilization circuit 312 is omitted from the fine/coarse delay comparison circuit 300, and the SHIFT signal is applied directly to the adjustable fine delay circuit 302.

After the phase of the clock signals has been matched, the value of the SHIFTd signal will be representative of the number of fine delay stages that results in a delay time equal to the delay time of the coarse delay stage 306. Assuming that the fine delay circuit 304 and the coarse delay stage 306 of the fine/coarse delay comparison circuit 300 are representative of a fine delay circuit and coarse delay stages present in the variable delay line (not shown) of a DLL circuit, then the SHIFTd signal can be used to adjust a trigger point between the fine delay circuit and coarse delay stages to eliminate non-linearities in the adjustment of the delay time of the variable delay line. That is, the SHIFTd signal can be used to set the relationship between the number of fine delay stages having an equivalent delay time to a coarse delay stage, and thus, compensate for deviations from an expected fine delay stage/coarse delay stage ratio.

Figure 4:
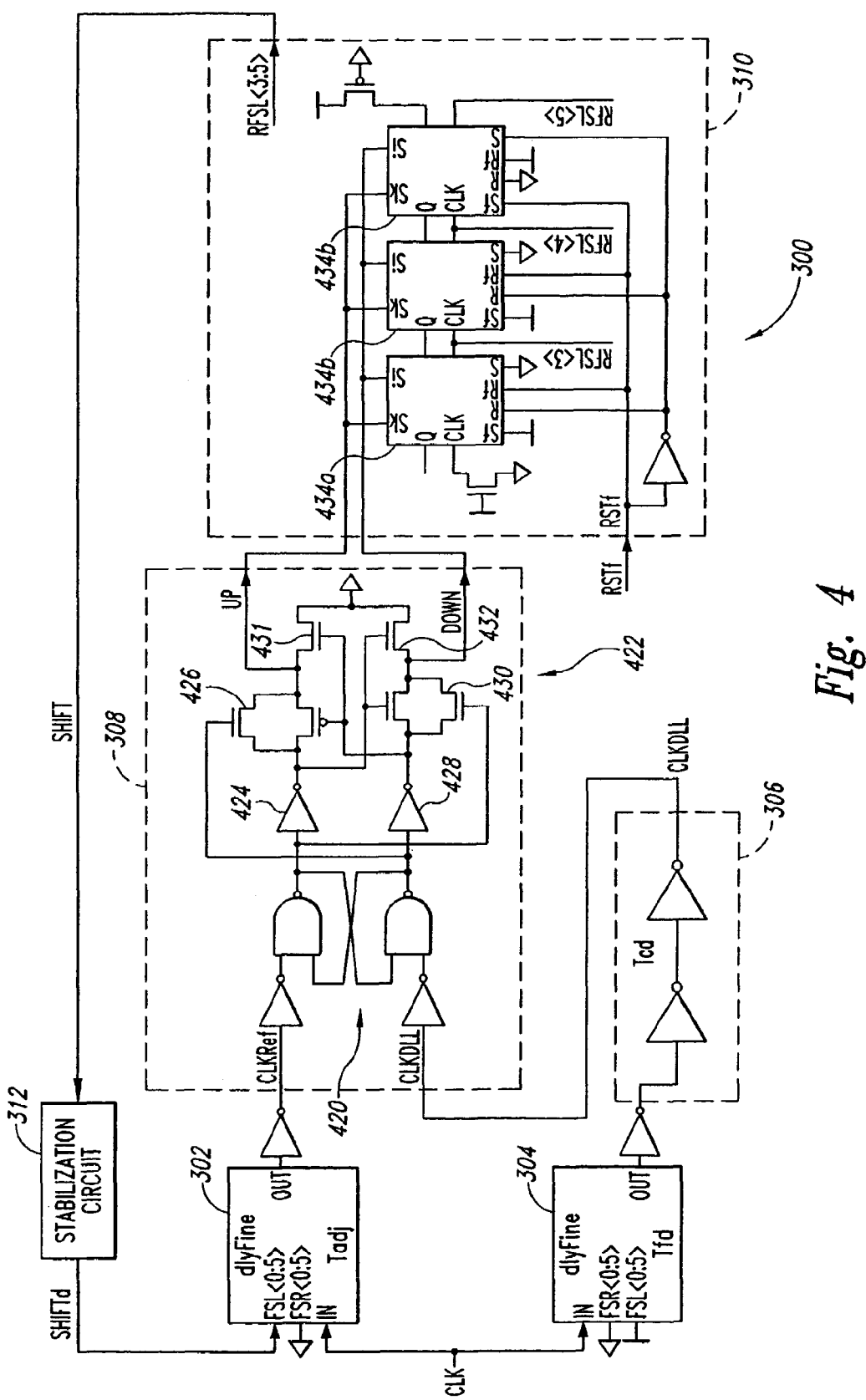
FIG. 4 is a schematic drawing the fine/coarse delay comparison circuit of FIG. 3.

FIG. 4 illustrates a schematic drawing of the block elements of the fine/coarse delay comparison circuit 300 of FIG. 3 according to an embodiment of the present invention. As previously described, the fine/coarse delay comparison circuit 300 includes an adjustable fine delay unit 302. Although alternative implementations can be used without departing from the scope of the present invention, the adjustable fine delay circuit 302 is shown in FIG. 4 as having first and second control terminals to which control signals can be applied to adjust the delay time Tadj. The first control terminal is coupled to the output of the shift register 310 to receive the SHIFTd signal from the signal stabilization circuit 312, and the second control terminal is coupled to ground. The SHIFT and SHIFTd signals, which as will be explained below, have three distinct signals representing a three-bit value. The three bits of the SHIFTd signal are used to activate or deactivate corresponding fine delay stages (not shown) in the adjustable fine delay circuit 302.

As previously discussed, fine/coarse delay comparison circuit 300 further includes a reference fine delay circuit 304 having its control terminals set to constant voltage levels. As a result, the delay time Tfd is indicative of the default delay time of an adjustable fine delay circuit. In FIG. 4, the reference fine delay circuit 304 has a first control terminal coupled to ground and a second control terminal coupled to constant non-zero voltage supply. As a result, the reference fine delay circuit 304 represents the default delay time Tfd of an adjustable fine delay circuit. That is, the resulting delay time Tfd is representative of an "unadjusted" delay time of the fine delay circuit 304. The output of the reference fine delay circuit 304 will be a clock signal delayed from the CLK signal by a delay time of Tfd. Coupled to the output of the reference fine delay circuit 304 is a coarse delay stage 306. The coarse delay stage 306 is shown to include first and second series coupled inverters 410, 412 to provide the CLKDLL signal to the phase detector 308. As previously discussed, the CLKDLL signal is delayed from the CLK signal by a time delay of (Tfd+Tcd).

It will be appreciated, that alternative implementations of the coarse delay stage 306 can be used in embodiments of the present invention without departing from the scope of the present invention. Examples of suitable alternative coarse delay stages are provided in commonly assigned, co-pending U.S. patent application Ser. No. 10/231,509 to Gomm et al., entitled POWER REDUCTION FOR DELAY LOCKED LOOP CIRCUITS, filed Dec. 19, 2002, which is incorporated herein by reference.

The phase detector 308 includes an active high set-reset (S-R) latch 420 having a first input coupled to the output of the adjustable fine delay circuit 304 and having a second input coupled to the output of the coarse delay stage 306. Further included in the phase detector 308 is a buffer circuit 422 coupled to the outputs of the latch 420. The selection circuit includes a first inverter 424 having an output coupled to a transfer gate 426 and a second inverter 428 coupled to a transfer gate 430. The output of each of the transfer gates 426, 430 are coupled to discharging transistors 431, 432, which have control terminals coupled the output of the inverters 428, 424, all respectively. The outputs of the transfer gates 426, 430 are further coupled to the shift register 310, with the transfer gate 426 coupled to the up-shift terminal and the transfer gate 430 coupled to the down-shift terminal of the shift register 310.

As shown in FIG. 4, the shift register 310 is shown as a three-bit shift register having three shift register stages 434a, 434b, 434c. Each shift register stage 434a, 434b, 434c provides one signal of a three-bit SHIFT control signal to the signal stabilization circuit 312 for stabilization, if necessary. The resulting three-bit stabilized signal SHIFTd is provided to the adjustable fine delay circuit 302. A reset signal RSTf is used to reset the shift register 310 to a default value. An example of when the shift register 310 would be reset is upon power up of the device in which the fine/coarse delay comparison circuit 300 is located. In the embodiment shown in FIG. 4, an active RSTf signal resets the shift register stages 434a, 434b, 434c to store a "001" value. More specifically, upon reset, the shift register stage 434a stores a "0", the shift register stage 434b stores a "0", and the shift register stage 434c stores a "1". In the event an active DOWN signal is applied to the shift register 310, the initial value of "001" will be modified to a shifted value of "011". Conversely, if an active UP signal is applied to the shift register 310, the initial value of "001" is modified to a shifted value of "000". Since a carry-out bit is not used in the shift register 310, if another positive transition of the UP signal occurs, the value of "000" will remain the same. Similarly, if the value stored by the shift register 310 is currently "111", and a positive transition of the DOWN signal occurs, the value of "111" will remain the same.

It will be appreciated that the specific details described with respect to the embodiment the fine/coarse delay comparison circuit 300 have been provided by way of example, and are not intended to limit the scope of the present invention. Alternative embodiments of the present invention include different implementations of various elements, such as the fine delay units 302 and 304, coarse delay stage 306, the phase detector 308, and the shift register 310. It will be further appreciated that the fine delay circuits 302, 304 and the coarse delay circuit 306 have intrinsic time delays that have been ignored in the present discussion of the fine/coarse delay comparison circuit 300. Discussion of the intrinsic delays have been omitted in order to avoid obscuring description of embodiments of the present invention.

Operation of the fine/coarse delay comparison circuit 300 will now be described with respect to FIG. 5. Initially, operation of the fine/coarse delay comparison circuit 300 will be described without reference to the signal stabilization circuit 312 in order to avoid unnecessarily complicating the description. Consequently, it will be assumed that the SHIFT signal is applied to the adjustable fine delay circuit 302 instead of the SHIFTd signal. However, explanation of the operation of the signal stabilization circuit 312 (i.e., SHIFTd signal) will be provided following the initial description.

Figure 5:
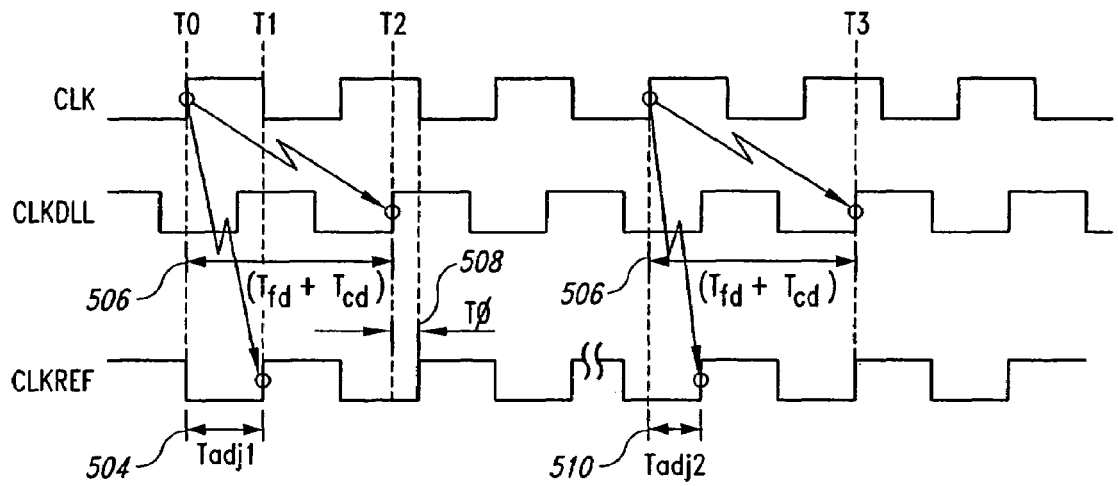
FIG. 5 is a signal timing diagram illustrating various signals during operation of the fine/coarse delay comparison circuit of FIG. 3.

FIG. 5 is a timing diagram showing various signals during the operation of the fine/coarse delay comparison circuit 300. The CLK signal is shown in FIG. 5, as well as the resulting CLKDLL and CLKREF signals. The rising edge of the CLKREF signal at time T1 corresponds to the rising edge of the CLK signal at time T0. As shown, the time delay between the times T0 and T1 is equal to the time delay Tadj1 504 of the adjustable fine delay circuit 302 with the initial SHIFT value of "001". The rising edge of the CLKDLL signal at time T2 corresponds to the rising edge of the CLK signal at the time T0. The time delay between the times T0 and T2 is the time delay of the reference fine delay circuit 304 and the coarse time delay stage 306, that is (Tfd+Tcd) 506. As a result of variations in the expected number of fine delay stages having a delay time equal to one coarse delay stage, the CLKDLL and CLKREF signals are out of phase by time TΦ 508.

As a result of the time TΦ 508, the phase detector 308 will generate a DOWN signal having a duty cycle greater than that of the UP signal. Consequently, although the initial value of "001" stored in the shift register 310 will be shifted to a value of "011" in response to a positive transition of the DOWN signal, and then shifted back to a value of "001" in response to a positive transition of the UP signal, the "011" value will be stored by the shift register for a longer time relative to the "001" value. As a result, until the CLKREF and CLKDLL signals are adjusted to be in phase, the value of the SHIFT signal applied to the adjustable fine delay circuit 302 will be "011" for a greater length of time than the "001" value. In the fine/coarse delay comparison circuit 300, the adjustable fine delay circuit 302 will decrease its delay time Tadj in response to receiving a SHIFT signal having a value of "011". Thus, the average of the delay time Tadj will be decreased until the delay of the adjustable fine delay circuit 302 is such that the CLKREF and CLKDLL signals are in phase. The CLKREF and CLKDLL signals are shown in phase in FIG. 5 at time T3 when the time delay Tadj of the adjustable fine delay circuit 302 is equal to Tadj2 510.

When the CLKREF and CLKDLL signals are in phase, the value of the SHIFT signal will be representative of the ratio between the number of fine delay stages that are equivalent to the delay of a coarse delay stage. Consequently, the SHIFT signal can be used by a delay controller of a DLL to set a trigger point at which transition occurs between a coarse delay stage and the fine delay in a variable delay line. Thus, any variations in the relationship between the fine delay and coarse delay is compensated for by the adjustment of the trigger point through the use of the SHIFT signal.

It will be appreciated that modifications to the previously described details can be made without departing from the scope of the present invention. For example, the fine/coarse delay comparison circuit 300 has been described as having a three-bit shift register 310. However, a shift register having greater or fewer number of bits can be used in alternative embodiments of the present invention and remain within the scope of the present invention. Generally, a greater number of bits of the shift register, and consequently, a greater number of bits for the SHIFT and SHIFTd signals, can provide a greater range of fine delay adjustment because each bit of the SHIFT and SHIFTd signals can be used to activate or deactivate a unit fine delay stage in the adjustable fine delay circuit 302. Also, shift register 310 of the fine/coarse delay comparison circuit 300 was previously described as having a reset value of "001". However, the reset value stored by the shift register 310 can be selected to accommodate characteristics of the fine delay and coarse delay circuits. That is, the delay circuits may have a tendency to either have a time delay greater than the expected delay, or have a time delay less than the expected delay, with respect to the number of fine delay stages providing an equivalent delay to one coarse delay stage. The reset value can be set accordingly to minimize the level of adjustment of the adjustable fine delay circuit 302 before achieving synchronization. The reset value of the shift register 310 determines the initial setting within the range of adjustment for the adjustable fine delay circuit 302. Thus, the reset value can be set in the shift register 310 at a value that will minimize the level of adjustment subsequent to resetting the shift register 310 necessary to obtain phase lock. Embodiments of the present invention can also be used with synchronizing circuits other than delay-locked loops, such as phased-locked loops, synchronous mirror delays, and the like. Those ordinarily skilled in the art will have sufficient understanding from the description provided herein to make the necessary modification to practice the invention in such cases. The previous discussion has been included to provide examples of the types of modifications that can be made to previously described embodiments and still remain within the scope of the present invention. However, it will be appreciated that many other modifications not specifically described herein can also be made without departing from the scope of the present invention. Thus, the previous examples should not be interpreted as limiting the scope of the present invention.

Figure 6:
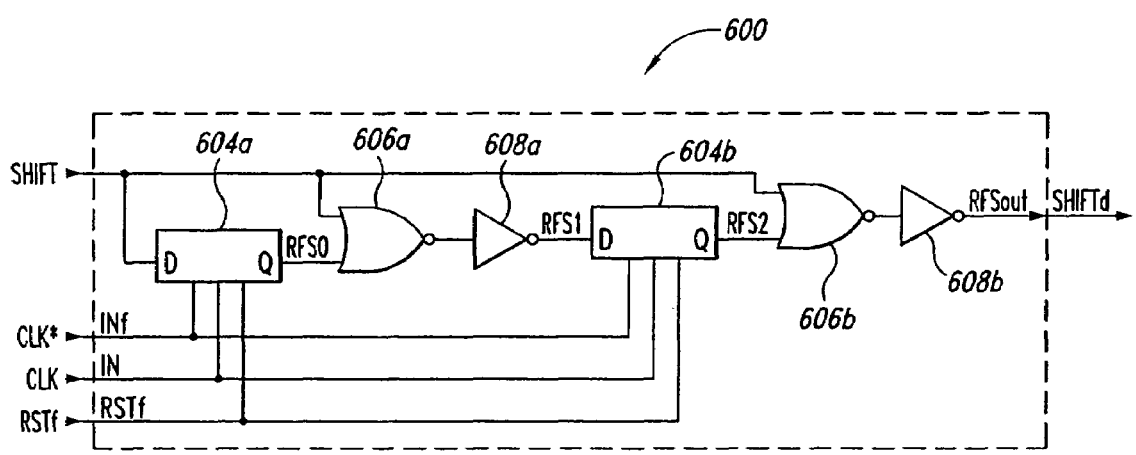
FIG. 6 is a functional block diagram of a delay compensation circuit according to an embodiment of the present invention.

FIG. 6 illustrates a delay compensation circuit 600 according to an embodiment of the present invention. The delay compensation circuit 600 can be substituted for the signal stabilization circuit 312 shown in FIGS. 3, 4, and 7. The SHIFT signal, the CLK signal and its complement CLK*, and the RSTf signal are provided to the delay compensation circuit 600. Circuitry for providing the CLK* signal is well known, and will not be described in detail herein. As previously discussed, the delay compensation circuit 600 stabilizes a rippling SHIFT signal and generates a stabilized control circuit SHIFTd for adjusting the time delay of the adjustable fine delay circuit 302. The SHIFTd signal can be used to compensate for variations from an expected relationship between a fine delay circuit and a coarse delay circuit since the SHIFTd signal is representative of the ratio between the number of fine delay stages providing a time delay equal to one coarse delay stage.

The SHIFT signal may ripple, or oscillate back and forth between two values, when attempting to adjust the time delay of the adjustable fine delay circuit 302 to synchronize the CLKREF and CLKDLL signals, but failing to do so because the delay time of one fine delay stage is too great and does not provide sufficient resolution for exact synchronization. That is, adding one fine delay stage provides too much delay to synchronize the phase of the CLKREF and CLKDLL signals, while removing one fine delay stage does not provide enough delay to synchronize the phase of the CLKREF and CLKDLL signals. As a result, the SHIFT signal can switch back and forth between two values since the exact time delay for synchronization is not available, thus, causing the SHIFT signal to "ripple."

The delay compensation circuit 600 avoids a rippling SHIFT signal by ignoring single-bit changes in the value of the SHIFT signal that occur within a certain number of periods of the CLK signal. The resulting stabilized signal, SHIFTd, maintains one of the two values between which the SHIFT signal oscillates. As shown in FIG. 6, the delay compensation circuit 600 provides the higher of two values when the SHIFT signal ripples. For example, if the value of the SHIFT signal changes back and forth between "011" and "111" within two periods of the CLK signal, the SHIFTd signal will remain at "111". The number of periods over which changes in the SHIFT signal are ignored corresponds to the number of sets of flip-flop 604, NOR gate 606, and inverter 608. The delay compensation circuit 600 of FIG. 6 includes two sets, the first set having flip-flop 604a, NOR gate 606a, inverter 608a, and the second set having flip-flop 604b, NOR gate 606b, inverter 608b. As a result, the delay compensation circuit 600 ignores single-bit changes of the SHIFT signal that occur within two periods of the CLK signal. It will be appreciated that fewer or greater sets of the flip-flop 604, NOR gate 606, and inverter 608 can be included in the delay compensation circuit to tailor the level of stabilization in the fine/coarse delay comparison circuit as desired.

Figure 7:
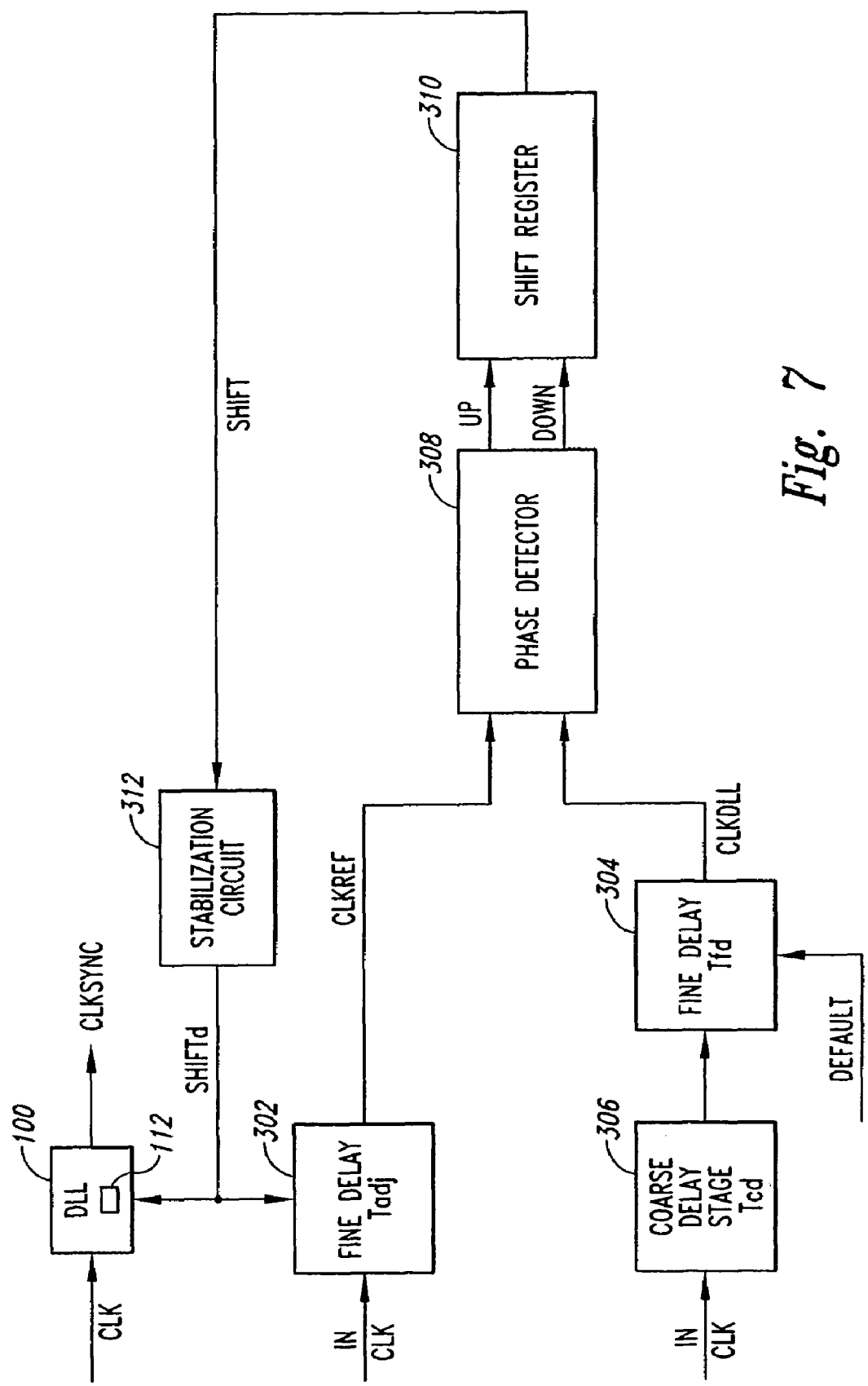
FIG. 7 is a functional block diagram of a fine/coarse delay comparison circuit according to another embodiment of the present invention.

FIG. 7 illustrates a fine/coarse delay comparison circuit 700 according to an alternative embodiment of the present invention. The fine/coarse delay comparison circuit 700 and the fine/coarse delay comparison circuit 300 are similar, having essentially the same functional blocks, namely, adjustable and reference fine delay circuits 302 and 304, a coarse delay stage 306, a phase detector 308, and a shift register 310. However, in the fine/coarse delay comparison circuit 700, the arrangement of the reference fine delay circuit 304 and the coarse delay stage 306 is reversed with respect to fine/coarse delay comparison circuit 300. Whereas the output of the reference fine delay 304 is applied to the coarse delay stage 306 in FIG. 3, the output of the coarse delay stage 306 is applied to the reference fine delay circuit 304 in FIG. 7. Operation of the fine/coarse delay comparison circuits 300 and 700 are the same, and in the interest of brevity, will not be repeated here with respect to describing the operation of the fine/coarse delay comparison circuit 700. Those of ordinary skill in the art, however, will appreciate that selection of either the fine/coarse delay comparison circuit 300 or 700 for implementation may be based on the desire to mirror the particular arrangement of the fine delay and coarse delay in the variable delay line of the DLL to which the SHIFT signal or SHIFTd signal is applied for compensation.

Figure 8:
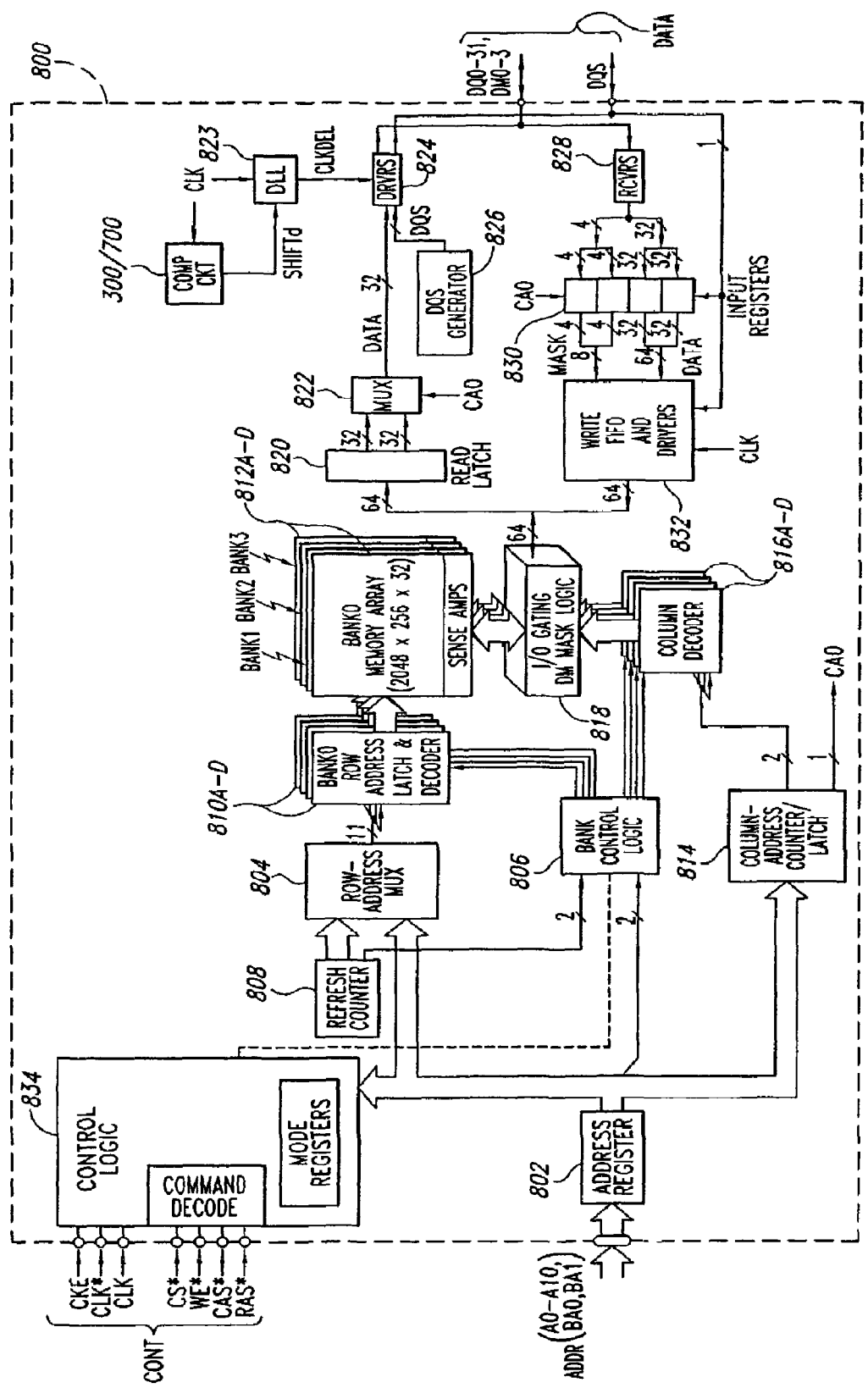
FIG. 8 is a functional block diagram illustrating a synchronous memory device including a fine/coarse delay comparison circuit according to an embodiment of the present invention.

FIG. 8 is a functional block diagram of a memory device 800 including a delay-locked loop 823 and a fine/coarse delay comparison circuit 300 of FIG. 3 and/or the fine/coarse delay comparison circuit 700 of FIG. 7. The memory device 800 in FIG. 8 is a double-data rate (DDR) synchronous dynamic random access memory ("SDRAM"), although the principles described herein are applicable to any memory device that may include a delay-locked loop for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 800 includes an address register 802 that receives row, column, and bank addresses over an address bus ADDR, with a memory controller (not shown) typically supplying the addresses. The address register 802 receives a row address and a bank address that are applied to a row address multiplexer 804 and bank control logic circuit 806, respectively. The row address multiplexer 804 applies either the row address received from the address register 802 or a refresh row address from a refresh counter 808 to a plurality of row address latch and decoders 810A–D. The bank control logic 806 activates the row address latch and decoder 810A–D corresponding to either the bank address received from the address register 802 or a refresh bank address from the refresh counter 808, and the activated row address latch and decoder latches and decodes the received row address. In response to the decoded row address, the activated row address latch and decoder 810A–D applies various signals to a corresponding memory bank 812A–D to thereby activate a row of memory cells corresponding to the decoded row address. Each memory bank 812A–D includes a memory-cell array having a plurality of memory cells arranged in rows and columns, and the data stored in the memory cells in the activated row is stored in sense amplifiers in the corresponding memory bank. The row address multiplexer 804 applies the refresh row address from the refresh counter 808 to the decoders 810A–D and the bank control logic circuit 806 uses the refresh bank address from the refresh counter when the memory device 800 operates in an auto-refresh or self-refresh mode of operation in response to an auto-or self-refresh command being applied to the memory device 800, as will be appreciated by those skilled in the art.

A column address is applied on the ADDR bus after the row and bank addresses, and the address register 802 applies the column address to a column address counter and latch 814 which, in turn, latches the column address and applies the latched column address to a plurality of column decoders 816A–D. The bank control logic 806 activates the column decoder 816A–D corresponding to the received bank address, and the activated column decoder decodes the applied column address. Depending on the operating mode of the memory device 800, the column address counter and latch 814 either directly applies the latched column address to the decoders 816A–D, or applies a sequence of column addresses to the decoders starting at the column address provided by the address register 802. In response to the column address from the counter and latch 814, the activated column decoder 816A–D applies decode and control signals to an I/O gating and data masking circuit 818 which, in turn, accesses memory cells corresponding to the decoded column address in the activated row of memory cells in the memory bank 812A–D being accessed.

During data read operations, data being read from the addressed memory cells is coupled through the I/O gating and data masking circuit 818 to a read latch 820. The I/O gating and data masking circuit 818 supplies N bits of data to the read latch 820, which then applies two N/2 bit words to a multiplexer 822. In the embodiment of FIG. 3, the circuit 818 provides 64 bits to the read latch 820 which, in turn, provides two 32 bits words to the multiplexer 822. A data driver 824 sequentially receives the N/2 bit words from the multiplexer 822 and also receives a data strobe signal DQS from a strobe signal generator 826 and a delayed clock signal CLKDEL from the delay-locked loop 823. The DQS signal is used by an external circuit such as a memory controller (not shown) in latching data from the memory device 800 during read operations. A fine/coarse delay comparison circuit 300/700 is coupled to the delay-locked loop 823 to provide a compensation signal SHIFTd. As previously discussed, the SHIFTd circuit can be used to set a trigger point between the fine delay and coarse delay of the delay-locked loop 823 in order to compensate for variations from the expected relationship between fine and coarse delay times.

In response to the delayed clock signal CLKDEL, the data driver 824 sequentially outputs the received N/2 bits words as a corresponding data word DQ, each data word being output in synchronism with a rising or falling edge of a CLK signal that is applied to clock the memory device 800. The data driver 824 also outputs the data strobe signal DQS having rising and falling edges in synchronism with rising and falling edges of the CLK signal, respectively. Each data word DQ and the data strobe signal DQS collectively define a data bus DATA. As will be appreciated by those skilled in the art, the CLKDEL signal from the delay-locked loop 823 is a delayed version of the CLK signal, and the delay-locked loop 823 adjusts the delay of the CLKDEL signal relative to the CLK signal to ensure that the DQS signal and the DQ words are placed on the DATA bus in synchronism with the CLK signal. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM0-X on the data bus DATA. A data receiver 828 receives each DQ word and the associated DM0-X signals, and applies these signals to input registers 830 that are clocked by the DQS signal. In response to a rising edge of the DQS signal, the input registers 830 latch a first N/2 bit DQ word and the associated DM0-X signals, and in response to a falling edge of the DQS signal the input registers latch the second N/2 bit DQ word and associated DM0-X signals. The input register 830 provides the two latched N/2 bit DQ words as an N-bit word to a write FIFO and driver 832, which clocks the applied DQ word and DM0-X signals into the write FIFO and driver in response to the DQS signal. The DQ word is clocked out of the write FIFO and driver 832 in response to the CLK signal, and is applied to the I/O gating and masking circuit 818. The I/O gating and masking circuit 818 transfers the DQ word to the addressed memory cells in the accessed bank 812A–D subject to the DM0-X signals, which may be used to selectively mask bits or groups of bits in the DQ words (i.e., in the write data) being written to the addressed memory cells.

A control logic and command decoder 834 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 834 latches and decodes an applied command, and generates a sequence of clocking and control signals that control the components 802–832 to execute the function of the applied command. The clock enable signal CKE enables clocking of the command decoder 834 by the clock signals CLK, CLK*. The command decoder 834 latches command and address signals at positive edges of the CLK, CLK* signals (i.e., the crossing point of CLK going high and CLK* going low), while the input registers 830 and data drivers 824 transfer data into and from, respectively, the memory device 800 in response to both edges of the data strobe signal DQS and thus at double the frequency of the clock signals CLK, CLK*. This is true because the DQS signal has the same frequency as the CLK, CLK* signals. The memory device 800 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 834 in generating the control and timing signals is conventional, and thus, for the sake of brevity, will not be described in more detail.

Figure 9:
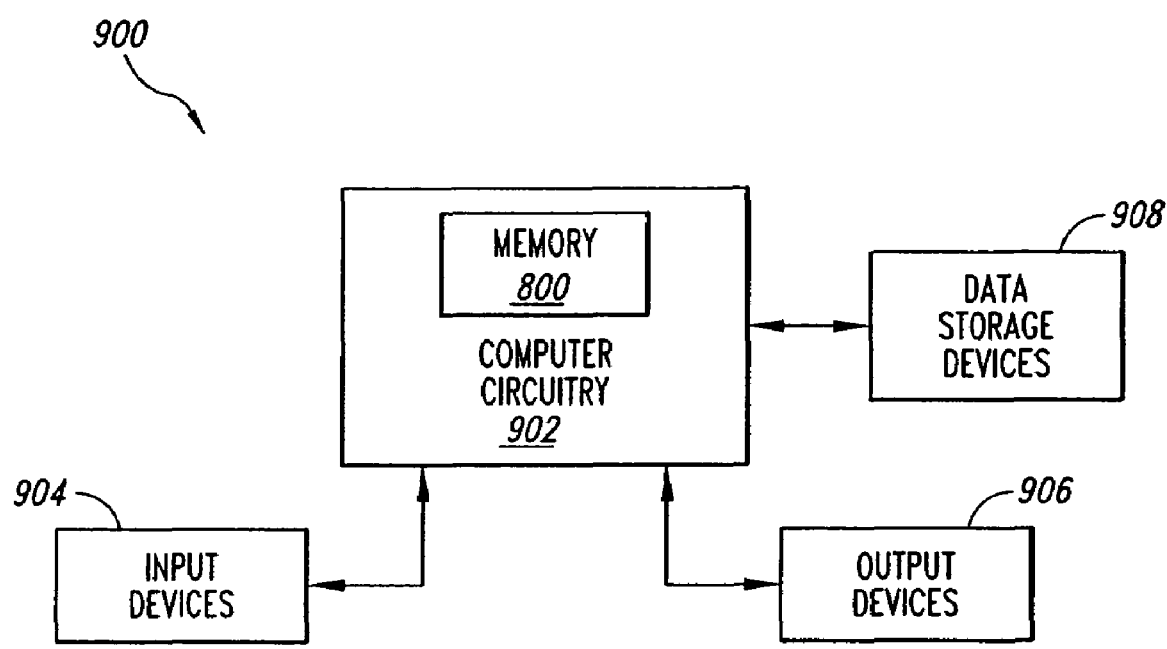
FIG. 9 is a functional block diagram illustrating a computer system including the synchronous memory device of FIG. 8.

FIG. 9 is a block diagram of a computer system 900 including computer circuitry 902 including the memory device 800 of FIG. 8. Typically, the computer circuitry 902 is coupled through address, data, and control buses to the memory device 800 to provide for writing data to and reading data from the memory device. The computer circuitry 902 includes circuitry for performing various computing functions, such as executing specific software to perform specific calculations or tasks. In addition, the computer system 900 includes one or more input devices 904, such as a keyboard or a mouse, coupled to the computer circuitry 902 to allow an operator to interface with the computer system. Typically, the computer system 900 also includes one or more output devices 906 coupled to the computer circuitry 902, such as output devices typically including a printer and a video terminal. One or more data storage devices 908 are also typically coupled to the computer circuitry 902 to store data or retrieve data from external storage media (not shown). Examples of typical storage devices 908 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. For example, many of the components described above may be implemented using either digital or analog circuitry, or a combination of both. Accordingly, the invention is not limited except as by the appended claims.

The invention claimed is:

1. A method for compensating for variance from a relationship between a first delay and a second delay the method comprising:
   delaying a clock signal by a reference delay to provide a first delayed clock signal, the reference time delay equal the total delay of a first reference delay and second reference delay;
   delaying the clock signal by an adjustable delay to provide a second delayed clock signal, the adjustable delay set by a control signal;
   determining a phase relationship between the first and second delayed clock signals;
   generating a signal indicative of the relationship between the first delay and the second delay;
   stabilizing the signal, the stabilized signal for use as the control signal for the adjustable delay; and
   adjusting in accordance with the stabilized signal a parameter affecting the relationship between the first delay and the second delay in response to the determined relationship being outside a variance range by setting a transition point at which a variable delay line having a plurality of first delay circuits and having a plurality of second delay circuits switches from a first delay circuit of the plurality to a second delay circuit of the plurality in accordance with the stabilized signal when the first and second delayed clock signals are in phase.

2. The method of claim 1 wherein delaying the clock signal by the reference delay comprises:
   delaying the clock signal by the first reference delay to provide an intermediate delayed clock signal; and
   further delaying the intermediate delayed clock signal by the second reference delay to provide the first delayed clock signal.

3. The method of claim 1 wherein generating the signal comprises:
   shifting a shift register in a direction according to the phase relationship between the first and second delayed clock signals; and
   applying output signals corresponding to a value of the shift register as the signal.

4. The method of claim 1 wherein stabilizing the signal comprises ignoring at least some transitions of the generated signal.

5. A method for compensating for variance from a relationship between a fine delay and a coarse delay of a variable delay line, the method comprising:
   determining a current relationship between the fine delay and the coarse delay;
   generating a compensation signal representing the current relationship between the fine delay and the coarse delay;
   stabilizing the compensation signal by ignoring at least one transition of the compensation signal occurring within at least one period of an input clock signal to provide a stabilized compensation signal; and
   setting in accordance with the stabilized compensation signal a transition point at which the variable delay line switches from a fine delay to a coarse delay based on the current determined relationship to compensate for the variance.

6. The method of claim 5 wherein determining the current relationship between the fine delay and the coarse delay comprises:
   delaying a clock signal by a reference delay to provide a first delayed clock signal, the reference time delay equal the total delay of a reference fine delay and a reference coarse delays;
   delaying the clock signal by an adjustable delay to provide a second delayed clock signal, the adjustable delay set by a control signal; and
   determining a phase relationship between the first and second delayed clock signals;
   the stabilized compensation signal for use as the control signal for the adjustable delay, the stabilized compensation signal further indicative of the relationship between the fine delay and the coarse delay when the first and second delayed clock signals are in phase.

7. The method of claim 6 wherein delaying the clock signal by the reference delay comprises:
   delaying the clock signal by the reference fine delay to provide an intermediate delayed clock signal; and
   further delaying the intermediate delayed clock signal by the reference coarse delay to provide the first delayed clock signal.

8. The method of claim 6 wherein generating the compensation signal comprises:
   shifting a shift register in a direction according to the phase relationship between the first and second delayed clock signals and;

generating output signals corresponding to a value of the shift register.

9. A method for determining a relationship between a first delay and a second delay, the first delay less than the second delay, the method comprising:
   delaying a clock signal by a reference delay to provide a first delayed clock signal, the reference time delay equal the total delay of a first reference delay and a second reference delay;
   delaying the clock signal by an adjustable delay to provide a second delayed clock signal, the adjustable delay set by a control signal;
   determining a phase relationship between the first and second delayed clock signals;
   generating a phase adjustment signal indicative of the phase relationship for use as the control signal for the adjustable delay, the phase adjustment signal further indicative of the relationship between the first delay and the second delay when the first and second delayed clock signals are in phase;
   filtering the phase adjustment signal to reduce rippling of the phase adjustment signal; and
   setting a transition point at which a variable delay line having a plurality of first delay circuits having the first delay and a plurality of second delay circuits having the second delay switches from a first delay of the plurality circuit to a second delay circuit of the plurality in accordance with the phase adjustment signal when the first and second delayed lock signals are in phase.

10. The method of claim 9 wherein filtering the phase adjustment signal comprises ignoring transitions of the phase adjustment signal within at least one period of the clock signal.

11. The method of claim 9 wherein generating the phase adjustment signal comprises:
   shifting a shift register in a direction according to the phase relationship between the first and second delayed clock signals; and
   applying output signals corresponding to a value of the shift register as the phase adjustment signal.

12. The method of claim 9 wherein the phase adjustment signal indicative of the relationship between the first delay and the second delay comprises a plurality of signals representative of a value corresponding to a ratio between the first delay and the second delay.

13. The method of claim 9 wherein delaying the clock signal by the reference delay comprises:
   delaying the clock signal by the first reference delay to provide an intermediate delayed clock signal; and
   further delaying the intermediate delayed clock signal by the second reference delay to provide the first delayed clock signal.

14. The method of claim 9 wherein delaying the clock signal by the reference delay comprises:
   delaying the clock signal by the second reference delay to provide an intermediate delayed clock signal; and
   further delaying the intermediate delayed clock signal by the first reference delay to provide the first delayed clock signal.

15. A method for determining a relationship between a fine delay of a fine delay circuit and a coarse delay of a coarse delay circuit, the method comprising:
   determining a phase relationship between a reference delay clock signal and an adjustable delay clock signal, the reference delay clock signal delayed from an input clock signal by the fine delay and the coarse delay and the adjustable delay clock signal delayed from the input clock signal by an adjustable time delay;
   generating a compensation signal based on the phase relationship between the reference delay clock signal and the adjustable delay clock signal;
   ignoring transitions of the compensation signal occurring within at least one period of the input clock signal to provide a filtered compensation signal; and
   adjusting the adjustable time delay to correct for the phase difference between the reference delay clock signal and the adjustable delay clock signal responsive to the filtered compensation signal, the resulting filtered compensation signal at phase lock representative of a ratio between the fine delay of the fine delay circuit and the coarse delay of the coarse delay circuit.

16. The method of claim 15 wherein determining the phase relationship between the reference delay clock signal and the adjustable delay clock signal comprises:
   delaying the input clock signal by a reference time delay to generate the reference delay clock signal;
   delaying the input clock signal by an adjustable time delay to generate the adjustable delay clock signal; and
   generating a phase signal indicative of the phase relationship between the reference delay clock signal and the adjustable delay clock signal.

17. The method of claim 16 wherein delaying the input clock signal by the reference time delay comprises:
   delaying the input clock signal by a reference fine delay to provide an intermediate clock signal; and
   delaying the intermediate clock signal by a reference coarse delay.

18. The method of claim 16 wherein delaying the input clock signal by the reference time delay comprises:
   delaying the input clock signal by a reference coarse delay to provide an intermediate clock signal; and
   delaying the intermediate clock signal by reference fine delay.

19. The method of claim 15, further comprising setting a transition point at which a variable delay line having a plurality of fine delay circuits and having a plurality of coarse delay circuits switches from a fine delay circuit of the plurality to a coarse delay circuit of the plurality in accordance with the filtered compensation signal at phase lock.

20. A method for compensating for variance from a relationship between a first delay of a first delay circuit and a second delay of a second delay circuit, the method comprising:
   delaying a clock signal by a reference delay to provide a first delayed clock signal, the reference time delay equal the total delay of a first reference delay and second reference delay;
   delaying the clock signal by an adjustable delay to provide a second delayed clock signal, the adjustable delay set by a control signal;
   determining a phase relationship between the first and second delayed clock signals;
   generating a signal indicative of the relationship between the first delay and the second delay;
   stabilizing the signal by ignoring at least some transitions of the generated signal, the stabilized signal for use as the control signal for the adjustable delay; and
   adjusting in accordance with the stabilized signal a parameter affecting the relationship between the first delay and the second delay in response to the determined relationship being outside a variance range.

21. The method of claim 20 wherein delaying the clock signal by the reference delay comprises:

delaying the clock signal by the first reference delay to provide an intermediate delayed clock signal; and further delaying the intermediate delayed clock signal by the second reference delay to provide the first delayed clock signal.

22. The method of claim 20 wherein generating the signal comprises:

shifting a shift register in a direction according to the phase relationship between the first and second delayed clock signals; and applying output signals corresponding to a value of the shift register as the signal.

23. The method of claim 20 wherein adjusting a parameter affecting the relationship between the first delay and the second delay in response to the determined relationship being outside a variance range comprises setting a transition point at which a variable delay line having a plurality of first delay circuits and having a plurality of second delay circuits switches from a first delay circuit of the plurality to a second delay circuit of the plurality in accordance with the stabilized signal when the first and second delayed clock signals are in phase.

24. A method for determining a relationship between a first delay and a second delay, the first delay less than the second delay, the method comprising:

delaying a clock signal by a reference delay to provide a first delayed clock signal, the reference time delay equal the total delay of a first reference delay and a second reference delays;

delaying the clock signal by an adjustable delay to provide a second delayed clock signal, the adjustable delay set by a control signal;

determining a phase relationship between the first and second delayed clock signals;

generating a phase adjustment signal indicative of the phase relationship for use as the control signal for the adjustable delay, the phase adjustment signal further indicative of the relationship between the first delay and the second delay when the first and second delayed clock signals are in phase; and filtering the phase adjustment signal to reduce rippling of the phase adjustment signal by ignoring transitions of the phase adjustment signal within at least one clock period.

25. The method of claim 24 wherein generating the phase adjustment signal comprises:

shifting a shift register in a direction according to the phase relationship between the first and second delayed clock signals; and applying output signals corresponding to a value of the shift register as the phase adjustment signal.

26. The method of claim 24 wherein the phase adjustment signal indicative of the relationship between the first delay and the second delay comprises a plurality of signals representative of a value corresponding to a ratio between the first delay and the second delay.

27. The method of claim 24, further comprising setting a transition point at which a variable delay line having a plurality of first delay circuits having the first delay and a plurality of second delay circuits having the second delay switches from a first delay circuit of the plurality to a second delay circuit of the plurality in accordance with the filtered phase adjustment signal when the first and second delayed lock signals are in phase.

28. The method of claim 24 wherein delaying the clock signal by the reference delay comprises:

delaying the clock signal by the first reference delay to provide an intermediate delayed clock signal; and further delaying the intermediate delayed clock signal by the second reference delay to provide the first delayed clock signal.

29. The method of claim 24 wherein delaying the clock signal by the reference delay comprises:

delaying the clock signal by the second reference delay to provide an intermediate delayed clock signal; and further delaying the intermediate delayed clock signal by the first reference delay to provide the first delayed clock signal.

* * * * *